United States Patent
Chau et al.

(10) Patent No.: US 8,409,954 B2
(45) Date of Patent: Apr. 2, 2013

(54) ULTRA-LOW DRAIN-SOURCE RESISTANCE POWER MOSFET

(75) Inventors: The-Tu Chau, San Jose, CA (US); Sharon Shi, San Jose, CA (US); Qufei Chen, San Jose, CA (US); Martin Hernandez, San Jose, CA (US); Deva Pattanayak, Saratoga, CA (US); Kyle Terrill, Santa Clara, CA (US); Kuo-In Chen, Los Altos, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 11/386,927

(22) Filed: Mar. 21, 2006

(65) Prior Publication Data
US 2007/0221989 A1    Sep. 27, 2007

(51) Int. Cl.
  *H01L 21/336* (2006.01)
(52) U.S. Cl. ............... 438/270; 257/341; 257/E29.257; 257/E29.26
(58) Field of Classification Search ............... 257/288, 257/401, 901, 341, E29.201, E29.257, E29.26; 438/270
See application file for complete search history.

(56) References Cited

U.S. PATENT DOCUMENTS

| | | | |
|---|---|---|---|
| 4,478,655 A | 10/1984 | Nagakubo et al. |
| 4,660,068 A | 4/1987 | Sakuma et al. |
| 4,758,531 A | 7/1988 | Beyer et al. |
| 4,799,990 A | 1/1989 | Kerbaugh et al. |
| 4,835,585 A | 5/1989 | Panousis |
| 4,843,025 A | 6/1989 | Morita |
| 4,857,986 A | 8/1989 | Kinugawa |
| 4,939,557 A | 7/1990 | Pao et al. |
| 5,087,586 A | 2/1992 | Chan et al. |
| 5,182,233 A | 1/1993 | Inoue |
| 5,366,914 A | 11/1994 | Takahashi et al. |
| 5,602,424 A | 2/1997 | Tsubouchi et al. |
| 5,814,858 A | 9/1998 | Williams |
| 5,963,822 A | 10/1999 | Saihara et al. |
| 5,965,904 A | 10/1999 | Ohtani et al. |
| 6,153,896 A | 11/2000 | Omura et al. |
| 6,180,966 B1 | 1/2001 | Kohno et al. |
| 6,245,615 B1 | 6/2001 | Noble et al. |
| 6,359,308 B1 | 3/2002 | Hijzen et al. |
| 6,436,791 B1 | 8/2002 | Lin et al. |
| 6,483,171 B1 | 11/2002 | Forbes et al. |

(Continued)

FOREIGN PATENT DOCUMENTS

| | | |
|---|---|---|
| EP | 0354449 | 2/1990 |
| EP | 0628337 | 12/1994 |

(Continued)

OTHER PUBLICATIONS

Los Alamos National Labs Periodic Table www.periodic.lanl.gov/elements/15.html.*

(Continued)

*Primary Examiner* — Brook Kebede

(57) ABSTRACT

Ultra-low drain-source resistance power MOSFET. In accordance with an embodiment of the preset invention, a semiconductor device comprises a plurality of trench power MOSFETs. The plurality of trench power MOSFETs is formed in a second epitaxial layer. The second epitaxial layer is formed adjacent and contiguous to a first epitaxial layer. The first epitaxial layer is formed adjacent and contiguous to a substrate highly doped with red Phosphorous. The novel red Phosphorous doped substrate enables a desirable low drain-source resistance.

7 Claims, 3 Drawing Sheets

U.S. PATENT DOCUMENTS

| | | | |
|---|---|---|---|
| 6,495,883 B2 | 12/2002 | Shibata et al. | |
| 6,580,154 B2 | 6/2003 | Noble et al. | |
| 6,630,389 B2 | 10/2003 | Shibata et al. | |
| 6,710,403 B2 | 3/2004 | Sapp | |
| 6,903,393 B2 | 6/2005 | Ohmi et al. | |
| 6,919,610 B2 | 7/2005 | Saitoh et al. | |
| 6,924,198 B2* | 8/2005 | Williams et al. | 438/270 |
| 6,960,821 B2 | 11/2005 | Noble et al. | |
| 6,995,439 B1 | 2/2006 | Hill et al. | |
| 7,217,606 B2 | 5/2007 | Forbes et al. | |
| 7,361,952 B2 | 4/2008 | Miura et al. | |
| 7,663,195 B2 | 2/2010 | Ohmi et al. | |
| 7,928,518 B2 | 4/2011 | Ohmi et al. | |
| 2001/0026006 A1 | 10/2001 | Noble et al. | |
| 2002/0104988 A1 | 8/2002 | Shibata et al. | |
| 2002/0155685 A1* | 10/2002 | Sakakibara | 438/500 |
| 2003/0008483 A1 | 1/2003 | Sato et al. | |
| 2003/0073271 A1 | 4/2003 | Birner et al. | |
| 2003/0082873 A1 | 5/2003 | Zambrano | |
| 2004/0155287 A1 | 8/2004 | Omura et al. | |
| 2004/0161886 A1 | 8/2004 | Forbes et al. | |
| 2004/0185665 A1 | 9/2004 | Kishimoto et al. | |
| 2004/0198003 A1 | 10/2004 | Yeo et al. | |
| 2005/0026369 A1 | 2/2005 | Noble et al. | |
| 2005/0029585 A1 | 2/2005 | He et al. | |
| 2005/0079678 A1 | 4/2005 | Verma et al. | |
| 2005/0224890 A1 | 10/2005 | Bernstein et al. | |
| 2005/0250276 A1 | 11/2005 | Heath et al. | |
| 2005/0253193 A1 | 11/2005 | Chen et al. | |
| 2005/0277278 A1 | 12/2005 | Maleville et al. | |
| 2006/0046419 A1 | 3/2006 | Sandhu et al. | |
| 2006/0081919 A1 | 4/2006 | Inoue et al. | |
| 2006/0091456 A1* | 5/2006 | Montgomery | 257/330 |
| 2006/0108635 A1 | 5/2006 | Bhalla et al. | |
| 2006/0128100 A1 | 6/2006 | Aoki et al. | |
| 2006/0138538 A1 | 6/2006 | Ohmi et al. | |
| 2006/0292825 A1 | 12/2006 | Lerner | |
| 2007/0034911 A1* | 2/2007 | Kao | 257/288 |
| 2008/0099344 A9 | 5/2008 | Basol et al. | |
| 2010/0032857 A1 | 2/2010 | Izadnegahdar et al. | |
| 2010/0072519 A1 | 3/2010 | Ohmi et al. | |

FOREIGN PATENT DOCUMENTS

| | | |
|---|---|---|
| EP | 1628337 A1 | 2/2006 |
| JP | 58100441 | 6/1983 |
| JP | 58168258 | 10/1983 |
| JP | 58197839 | 11/1983 |
| JP | 61022630 | 1/1986 |
| JP | 61256739 | 11/1986 |
| JP | 62298130 | 12/1987 |
| JP | 63284832 | 11/1988 |
| JP | 401008672 * | 1/1989 |
| JP | 02035736 | 2/1990 |
| JP | 02058248 | 2/1990 |
| JP | 2002231945 | 8/2002 |
| JP | 2004056003 | 2/2004 |
| JP | 2004146626 | 5/2004 |
| JP | 2004356114 | 12/2004 |
| KR | 1020040036958 A | 5/2004 |
| WO | 2004105116 | 12/2004 |
| WO | 2006058210 | 6/2006 |

OTHER PUBLICATIONS

Peter Van Zant, Microchip Fabrication, 2000, McGraw-Hill Publication, Fourth Edition, p. 32.*

Requirement for Restriction/Election Mail Date Nov. 1, 2007; U.S. Appl. No. 11/373,630.

Non-Final Office Action Mail Date Feb. 13, 2008; U.S. Appl. No. 11/373,630.

Final Office Action Mail Date Aug. 12, 2008; U.S. Appl. No. 11/373,630.

Non-Final Office Action Mail Date Mar. 5, 2009; U.S. Appl. No. 11/373,630.

Supplemental Non-Final Office Action Mail Date Aug. 14, 2009; U.S. Appl. No. 11/373,630.

Final Office Action Mail Date Feb. 16, 2010; U.S. Appl. No. 11/373,630.

Non-Final Office Action Mail Date Aug. 11, 2010; U.S. Appl. No. 11/373,630.

Final Office Action Mail Date Jan. 13, 2011; U.S. Appl. No. 11/373,630.

Advisory Action Mail Date May 6, 2010; U.S. Appl. No. 11/373,630.

Interview Summary Mail Date Jul. 27, 2010; U.S. Appl. No. 11/373,630.

Interview Summary Mail Date Jan. 12, 2010; U.S. Appl. No. 11/373,630.

Requirement for Restriction/Election Mail Date Apr. 18, 2008; U.S. Appl. No. 11/644,553.

Non-Final Office Action Mail Date Jun. 25, 2008; U.S. Appl. No. 11/644,553.

Non-Final Office Action Mail Date Feb. 5, 2009; U.S. Appl. No. 11/644,553.

Non-Final Office Action Mail Date Nov. 25, 2009; U.S. Appl. No. 11/644,553.

Final Office Action Mail Date Apr. 8, 2010; U.S. Appl. No. 11/644,553.

Non-Final Office Action Mail Date Dec. 6, 2010; U.S. Appl. No. 11/644,553.

Non-Final Office Action Mail Date Jun. 25, 2009; U.S. Appl. No. 12/123,664.

Non-Final Office Action Mail Date Feb. 4, 2010; U.S. Appl. No. 12/123,664.

Advisory Action Mail Date Apr. 15, 2010; U.S. Appl. No. 12/123,664.

Interview Summary Mail Date Jul. 29, 2010; U.S. Appl. No. 12/123,664.

Notice of Allowance Mail Date Oct. 4, 2010; U.S. Appl. No. 12/123,664.

Non-Final Office Action Mail Date Jan. 20, 2011; U.S. Appl. No. 12/123,664.

Nakamura et al., "Effects of Selecting Channel Direction in Improving Performance of Sub-100nm MOSFETs Fabricated on (110) Surface Si Substrate", Japanese Journal of Applied Physics, vol. 43, No. 4B, Apr. 2004, pp. 1723-1728.

Non-Final Office Action Mail Date Jun. 9, 2009; U.S. Appl. No. 12/030,809.

Final Office Action Mail Date Dec. 17, 2009; U.S. Appl. No. 12/030,809.

Supplemental Non-Final Office Action Mail Date Mar. 10, 2010; U.S. Appl. No. 12/030,809.

Non-Final Office Action Mail Date Jul. 16, 2010; U.S. Appl. No. 12/030,809.

Final Office Action Mail Date Dec. 28, 2010; U.S. Appl. No. 12/030,809.

Non-Final Office Action Mail Date Sep. 16, 2010; U.S. Appl. No. 12/069,712.

Interview Summary Mail Date Jan. 12, 2011; U.S. Appl. No. 11/373,630.

Non-Final Office Action Mail Date May 26, 2009; U.S. Appl. No. 12/069,712.

Final Office Action Mail Date Feb. 25, 2010; U.S. Appl. No. 12/069,712.

Advisory Action Mail Date May 6, 2010; U.S. Appl. No. 12/069,712.

Non-Final Office Action Mail Date Sep. 16, 2009; U.S. Appl. No. 12/069,712.

Advisory Action Mail Date Mar. 28, 2011; U.S. Appl. No. 11/373,630.

Final Office Action Mail Date Jun. 7, 2011; U.S. Appl. No. 12/069,712.

Advisory Action Mail Date Mar. 21, 2011; U.S. Appl. No. 12/030,890.

Non-Final Office Action Mail Date Aug. 31, 2011; U.S. Appl. No. 11/373,630.

Final Office Action Mail Date Aug. 18, 2011; U.S. Appl. No. 11/644,553.

Advisory Action Mail Date Aug. 30, 2011; U.S. Appl. No. 12/069,712.
Final Office Action Mail Date Oct. 17, 2011; U.S. Appl. No. 12/123,664.
Advisory Action Mail Date Mar. 21, 2011; U.S. Appl. No. 12/030,809.

Non-Final Office Action Mail Date Mar. 28, 2012; U.S. Appl. No. 11/644,553.
Non-Final Office Action Mail Date Feb. 29, 2012; U.S. Appl. No. 11/373,630.

* cited by examiner

ULTRA-LOW DRAIN-SOURCE RESISTANCE POWER MOSFET

TECHNICAL FIELD

Embodiments of the present invention relate to the fields of design and manufacturing semiconductors, and more particularly to systems and methods for forming ultra-low drain-source resistance power metal oxide semiconductor field effect transistors (MOSFETs).

BACKGROUND

Power metal oxide semiconductor field effect transistors (MOSFETs) have wide application in the electronic arts, for example in switching power supplies, motor driving circuits and the like. In many applications, a decreased ON resistance, or drain to source resistance, $R_{DS}$, of a power MOSFET is desirable.

SUMMARY

Therefore, there is a need for systems and methods for ultra-low drain-source resistance power MOSFETs. In addition to the aforementioned need, there is a need for ultra-low drain-source resistance power MOSFETs with improved breakdown voltage characteristics. Further, there is a need for providing for the aforementioned needs in a manner that is compatible and complimentary with existing semiconductor processing systems and manufacturing processes.

Accordingly, an ultra-low drain-source resistance power metal oxide semiconductor field effect transistor is disclosed. In accordance with a first embodiment of the present invention, a semiconductor device comprises a substrate doped with red Phosphorous.

In accordance with another embodiment of the preset invention, a semiconductor device comprises a plurality of trench power MOSFETs. The plurality of trench power MOSFETs is formed in a second epitaxial layer. The second epitaxial layer is formed adjacent and contiguous to a first epitaxial layer. The first epitaxial layer is formed adjacent and contiguous to a substrate highly doped with red Phosphorous.

BEST MODES FOR CARRYING OUT THE INVENTION

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Ultra-Low Drain-Source Resistance Power MOSFET

Although embodiments of in accordance with the present invention are herein described in terms of power MOSFETs, it is to be appreciated that embodiments of in accordance with the present invention are well suited to other types of semiconductors, e.g., semiconductors in which a low substrate resistance is desirable, and that such embodiments are within the scope of the present invention.

Conventional semiconductor designs and processing techniques are generally unable to produce a power metal oxide semiconductor field effect transistor characterized as having a drain to source resistance, $R_{DS}$, of less than about two milliohms per centimeter. For example, a conventional n-channel MOSFET is generally fabricated utilizing an Arsenic-doped substrate. The figure of two milliohms per centimeter is approximately a physical limit of such an Arsenic-doped substrate. Further, the substrate typically contributes about 40% of the ON resistance in conventional power MOSFETs.

Figure 1:
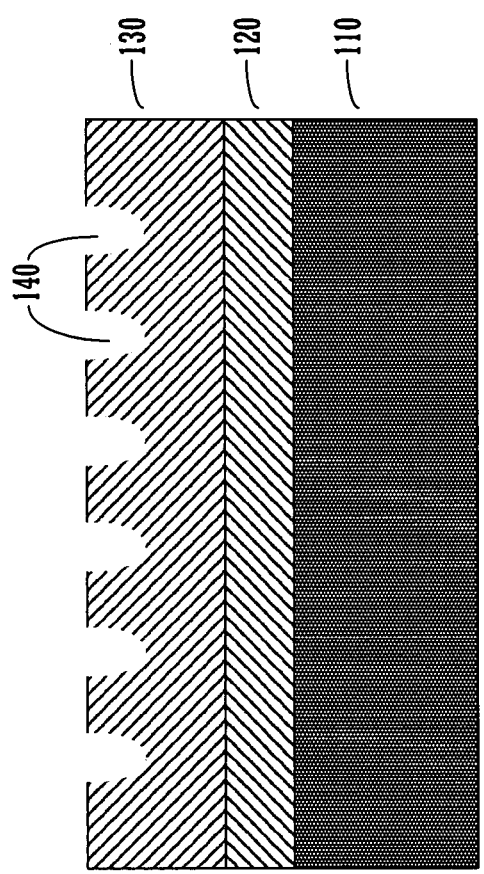
FIG. 1 illustrates a cross sectional view of power MOSFET, in accordance with embodiments of the present invention.

FIG. 1 illustrates a cross sectional view of power MOSFET 100, in accordance with embodiments of the present invention. It is appreciated that FIG. 1 is not drawn to scale, and that relative dimensions have, in some cases, been exaggerated to illustrate specific features. MOSFET 100 comprises a novel red Phosphorous-doped substrate 110. It is appreciated that red Phosphorous is one of the three main allotropes of Phosphorous.

In one embodiment of the present invention, substrate 110 is doped to a level of about $1.0 \times 10^{20}$ dopant atoms per cubic centimeter. At this doping level, substrate 110 achieves an advantageously low resistant of better than about 1.0 to 1.5 milliohms per square centimeter. It is to be appreciated that other doping levels are well suited to embodiments in accordance with the present invention.

In accordance with another embodiment of the present invention, substrate 110 is doped to a level of about $7.5 \times 10^{19}$ to $1.1 \times 10^{20}$ dopant atoms per cubic centimeter. At this doping level, substrate 110 achieves an advantageously low resistant of less than about 1.0 milliohms per square centimeter.

A conventional approach to reducing ON resistance of a power MOSFET is to reduce a thickness of an epitaxial layer and/or to create shallow drains. Deleteriously, semiconductor manufacturing techniques impose limits as to minimum size of such features. An additional drawback of such thin epitaxial layers is an undesirable reduction in breakdown voltage.

Red Phosphorous is generally characterized as having a high diffusion behavior. Such diffusion can lead to deleterious lowered breakdown voltages due to the Early effect.

Power MOSFET 100 further comprises a first epitaxial layer 120, deposed adjacent to substrate 110. In one embodiment of the present invention, first epitaxial layer 120 is doped to a level of about $1.0 \times 10^{18} \pm$ about 5% dopant atoms per cubic centimeter. It is to be appreciated that other doping levels are well suited to embodiments in accordance with the present invention. One function of first epitaxial layer 120 is to limit the diffusion of red Phosphorous from substrate 110.

Power MOSFET 100 further comprises a second epitaxial layer 130, deposed adjacent to first epitaxial layer 120. In one embodiment of the present invention, second epitaxial layer 130 is doped to a level of about $1.0 \times 10^{16}$ dopant atoms per cubic centimeter with, for example, Arsenic and/or Phosphorous. It is to be appreciated that other doping levels as well as different dopants are well suited to embodiments in accordance with the present invention.

Trench devices 140 of well-known design are constructed in second epitaxial layer 130.

In accordance with embodiments of the present invention, the thickness, relative thickness, doping levels and dopant species of the first and second epitaxial layers can be designed to achieve a desirable high breakdown voltage in conjunction with an advantageous low ON resistance. For example, as the diffusion coefficient of Arsenic is smaller than that of Phosphorous, a first epitaxial layer comprising Arsenic dopants can be made thinner than a first epitaxial layer comprising Phosphorous dopants, beneficially decreasing ON resistance.

Figure 2:
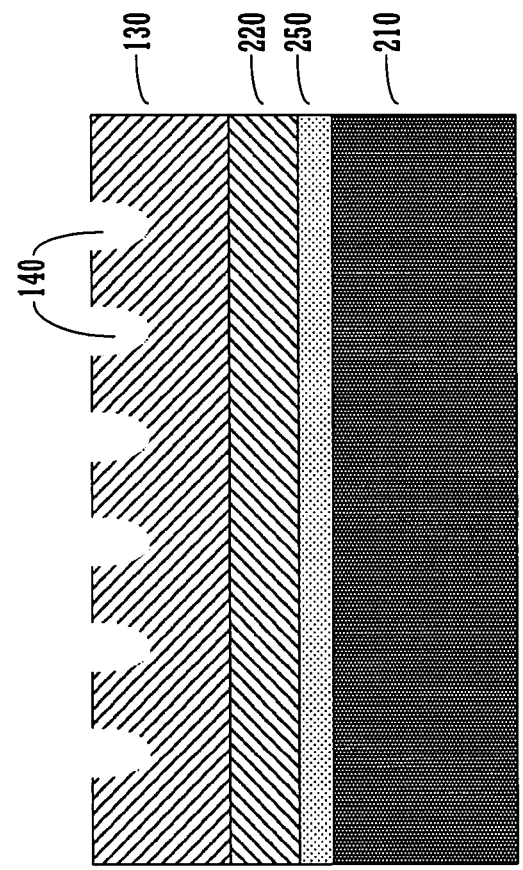
FIG. 2 illustrates a cross sectional view of power MOSFET, in accordance with alternative embodiments of the present invention.

FIG. 2 illustrates a cross sectional view of power MOSFET 200, in accordance with embodiments of the present invention. It is appreciated that FIG. 2 is not drawn to scale, and that relative dimensions have, in some cases, been exaggerated to illustrate specific features. MOSFET 200 comprises a red Phosphorous-doped substrate 210. Substrate 210 is generally similar to substrate 110 (FIG. 1), e.g., doping levels are comparable. MOSFET 200 comprises a first epitaxial layer 220. First epitaxial layer 220 may vary in thickness, dopants and/or doping levels from first epitaxial layer 120 (FIG. 1) due to the presence of implant layer 250.

MOSFET 200 comprises an implant layer 250 adjacent to a boundary between the substrate 210 and the first epitaxial layer 220. Implant layer 250 may be formed at a depth considered to be within substrate 210, at a depth considered to be within first epitaxial layer 220 or at a depth that crosses a boundary between substrate 210 and first epitaxial layer 220, in accordance with embodiments of the present invention. Implant layer 250 may comprise implanted atoms of Arsenic or Antimony, for example.

One function of implant layer 250 is to limit the diffusion of red Phosphorous from substrate 210. In this novel manner, first epitaxial layer 220 can be made thinner in comparison to a corresponding epitaxial layer in a semiconductor without an implant layer, e.g., first epitaxial layer 120 (FIG. 1), beneficially decreasing ON resistance.

Figure 3:
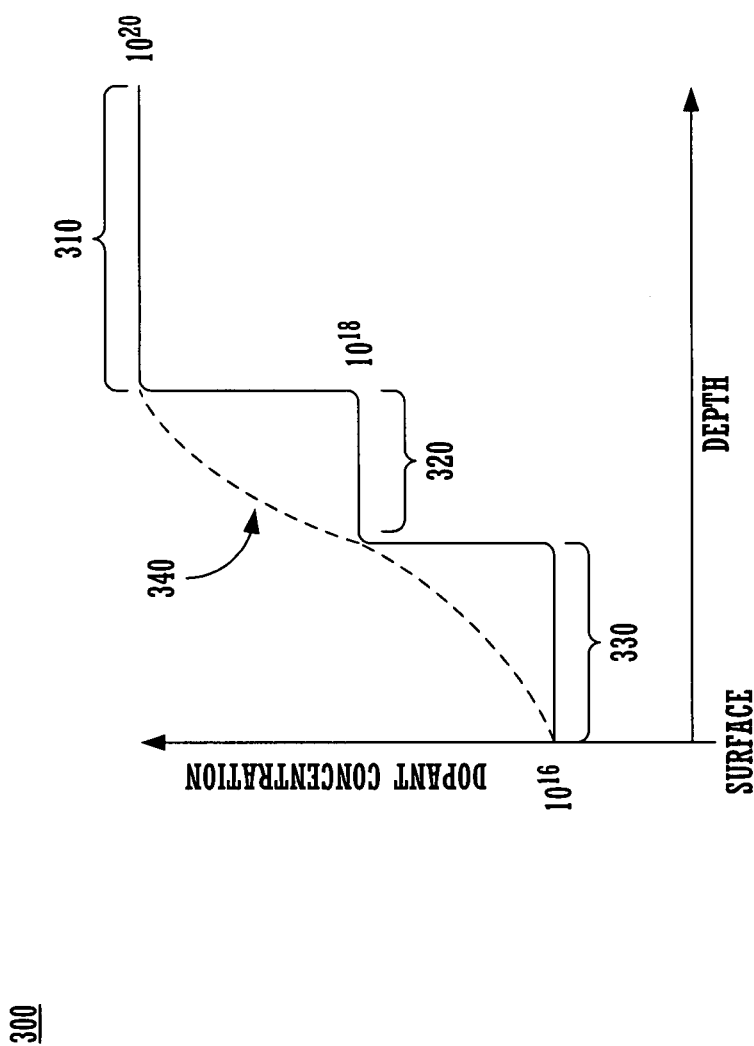
FIG. 3 illustrates an exemplary doping profile of a semiconductor, in accordance with embodiments of the present invention.

FIG. 3 illustrates an exemplary doping profile 300 of a semiconductor, in accordance with embodiments of the present invention. In doping profile 300, the horizontal axis represents depth from a surface of a semiconductor, and the vertical axis represents dopant concentration. It is appreciated that doping profile 300 is not drawn to scale.

Region 310 of doping profile 300 represents a doping level of a substrate, e.g., substrate 110 of FIG. 1. In accordance with embodiments of the present invention, region 310 represents a doping level of red Phosphorous. Region 320 represents a doping level of a first epitaxial layer adjacent to the substrate, e.g., first epitaxial layer 120 of FIG. 1.

Region 330 represents a doping level of a second epitaxial layer adjacent to the first epitaxial layer, e.g., second epitaxial layer 130 of FIG. 1. Curve 340 represents a doping profile of a semiconductor after a thermal diffusion. In accordance with embodiments of the present invention, the thickness, relative thickness, doping levels and dopant species of the first and second epitaxial layers can be designed to achieve a desirable high breakdown voltage in conjunction with an advantageous low ON resistance.

In accordance with alternative embodiments of the present invention, a novel Antimony-doped substrate may be utilized. Antimony is characterized as having a very low diffusion coefficient, e.g., lower than that of Phosphorous.

Thus, embodiments in accordance with the present invention provide systems and methods ultra-low drain-source resistance power MOSFETs. Additionally, in conjunction with the aforementioned benefit, embodiments of the present invention provide systems and methods for ultra-low drain-source resistance power MOSFETs that enable improved breakdown voltage characteristics. As a further benefit, in conjunction with the aforementioned benefits, systems and methods of ultra-low drain-source resistance power MOSFETs are provided in a manner that is compatible and complimentary with existing semiconductor processing systems and manufacturing processes.

Embodiments in accordance with the present invention, ultra-low drain-source resistance power MOSFET, are thus described. While the present invention has been described in particular embodiments, it should be appreciated that the present invention should not be construed as limited by such embodiments, but rather construed according to the below claims.

What is claimed is:

1. A semiconductor device comprising:
   a substrate doped with atoms of the set comprising red Phosphorus and Antimony;
   a first epitaxial layer disposed adjacent to said substrate, the first epitaxial layer characterized in that it limits the diffusion of red Phosphorous from the substrate; and
   a second epitaxial layer disposed adjacent to said first epitaxial layer for formation of trench metal oxide semiconductor field effect transistors.

2. The semiconductor device of claim 1 wherein said substrate is doped to a concentration of greater than or equal to about $1.0 \times 10^{20}$ of said particles.

3. The semiconductor device of claim 1 wherein a resistance of said substrate is less than about 1.5 milliohms per centimeter.

4. A semiconductor device comprising: a first epitaxial layer formed on a red Phosphorous and Antimony doped substrate, wherein said first epitaxial layer characterized in that it limits the diffusion of said red Phosphorous from said substrate; a second epitaxial layer; and a plurality of trench power MOSFETs formed in said second epitaxial layer, and wherein said second epitaxial layer is formed adjacent and contiguous to said first epitaxial layer.

5. The semiconductor device of claim 4 wherein said substrate is doped to a concentration of greater than or equal to about $1.0 \times 10^{20}$ atoms of said red Phosphorus per cubic centimeter.

6. The semiconductor device of claim 4 wherein a resistance of said substrate is less than about 1.5 milliohms per centimeter.

7. The semiconductor of claim 4 further comprising an implanted layer adjacent to a boundary between said substrate and said first epitaxial layer.

* * * * *